(12) United States Patent
Ping et al.

(10) Patent No.: US 11,985,815 B2
(45) Date of Patent: May 14, 2024

(54) METHOD FOR MANUFACTURING MEMORY AND SAME

(71) Applicant: CHANGXIN MEMORY TECHNOLOGIES, INC., Hefei (CN)

(72) Inventors: Er-Xuan Ping, Hefei (CN); Zhen Zhou, Hefei (CN); Lingguo Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 126 days.

(21) Appl. No.: 17/479,162

(22) Filed: Sep. 20, 2021

(65) Prior Publication Data

US 2022/0093607 A1     Mar. 24, 2022

Related U.S. Application Data

(63) Continuation of application No. PCT/CN2021/103820, filed on Jun. 30, 2021.

(30) Foreign Application Priority Data

Sep. 24, 2020   (CN) .......................... 202011018122.5

(51) Int. Cl.
   *H01L 27/108*     (2006.01)
   *H10B 12/00*      (2023.01)

(52) U.S. Cl.
   CPC ......... *H10B 12/482* (2023.02); *H10B 12/485* (2023.02)

(58) Field of Classification Search
   CPC ........................... H10B 12/482; H10B 12/485
   See application file for complete search history.

(56) References Cited

U.S. PATENT DOCUMENTS

| 7,648,875 B2 | 1/2010 | Hong |
| 7,767,569 B2 | 8/2010 | Maekawa |

(Continued)

FOREIGN PATENT DOCUMENTS

| CN | 1959953 A | 5/2007 |
| CN | 101075093 A | 11/2007 |

(Continued)

OTHER PUBLICATIONS

International Search Report in the international application No. PCT/CN2021/100327, dated Sep. 9, 2021. 7 pages with English translation.

(Continued)

*Primary Examiner* — Mohammed R Alam
(74) *Attorney, Agent, or Firm* — Cooper Legal Group, LLC

(57) ABSTRACT

A method for manufacturing a memory includes the following operations. A substrate and a plurality of separate initial bit line contact structures are provided, in which a plurality of active regions are formed in the substrate, and each of the initial bit line contact structures is electrically connected with the active regions, and each of the initial bit line contact structures is partially located in the substrate. Pseudo-bit line structures on the tops of the initial bit line contact structures are formed. The initial bit line contact structures are etched to form bit line contact layers and gaps between the substrate and the side walls of the bit line contact layers. First dielectric layers are formed on the side walls of the pseudo-bit line structures, in which the first dielectric layers are also located right above the gaps.

15 Claims, 17 Drawing Sheets

(56) References Cited

U.S. PATENT DOCUMENTS

| | | | |
|---|---|---|---|
| 7,846,827 | B2 | 12/2010 | Kim |
| 8,748,254 | B2 | 6/2014 | Lee |
| 9,691,700 | B2 | 6/2017 | Kuroki |
| 9,837,490 | B2 | 12/2017 | Park et al. |
| 10,181,473 | B2 | 1/2019 | Feng et al. |
| 10,453,849 | B2 | 10/2019 | Liou et al. |
| 10,461,153 | B2 | 10/2019 | Lee et al. |
| 10,600,790 | B2 | 3/2020 | Feng et al. |
| 10,622,249 | B2 | 4/2020 | Yoon |
| 10,763,264 | B2 | 9/2020 | Liou et al. |
| 10,886,276 | B2 | 1/2021 | Hwang |
| 10,923,390 | B2 | 2/2021 | Yoon |
| 2006/0146595 | A1 | 7/2006 | Hong |
| 2006/0148227 | A1 | 7/2006 | Kronke |
| 2007/0096188 | A1 | 5/2007 | Maekawa |
| 2010/0233878 | A1 | 9/2010 | Kim |
| 2012/0043642 | A1 | 2/2012 | Kuroki |
| 2013/0052787 | A1 | 2/2013 | Lee |
| 2017/0005166 | A1 | 1/2017 | Park et al. |
| 2017/0084613 | A1 | 3/2017 | Found |
| 2018/0226408 | A1 | 8/2018 | Feng et al. |
| 2019/0019805 | A1 | 1/2019 | Feng et al. |
| 2019/0088739 | A1 | 3/2019 | Lee et al. |
| 2019/0103302 | A1 | 4/2019 | Yoon |
| 2019/0273083 | A1 | 9/2019 | Liou et al. |
| 2020/0013783 | A1 | 1/2020 | Liou et al. |
| 2020/0203213 | A1 | 6/2020 | Yoon |
| 2021/0035613 | A1* | 2/2021 | Park .................. H10B 12/485 |

FOREIGN PATENT DOCUMENTS

| | | | |
|---|---|---|---|
| CN | 103730435 | A | 4/2014 |
| CN | 102347331 | B | 12/2015 |
| CN | 102543944 | B | 6/2016 |
| CN | 107482007 | A | 12/2017 |
| CN | 107611133 | A | 1/2018 |
| CN | 107611133 | B | 8/2018 |
| CN | 108389860 | A | 8/2018 |
| CN | 109148376 | A | 1/2019 |
| CN | 109244090 | A | 1/2019 |
| CN | 109524383 | A | 3/2019 |
| CN | 109962018 | A | 7/2019 |
| CN | 109979940 | A | 7/2019 |
| CN | 209216973 | U | 8/2019 |
| CN | 110223982 | A | 9/2019 |
| CN | 110491880 | A | 11/2019 |
| CN | 110890365 | A | 3/2020 |
| CN | 110957320 | A | 4/2020 |

OTHER PUBLICATIONS

International Search Report in the international application No. PCT/CN2021/106848, dated Oct. 19, 2021. 5 pages with English translation.
International Search Report in the international application No. PCT/CN2021/103864, dated Oct. 11, 2021. 5 pages with English translation.
International Search Report in the international application No. PCT/CN2021/103820, dated Aug. 31, 2021. 5 pages with English translation.
Written Opinion of the International Search Authority in the international application No. PCT/CN2021/100327, dated Sep. 9, 2021. 7 pages with English translation.
Written Opinion of the International Search Authority in the international application No. PCT/CN2021/106848, dated Oct. 19, 2021. 7 pages with English translation.
Written Opinion of the International Search Authority in the international application No. PCT/CN2021/103864, dated Oct. 11, 2021. 6 pages with English translation.
Written Opinion of the International Search Authority in the international application No. PCT/CN2021/103820, dated Aug. 31, 2021. 6 pages with English translation.
First Office Action of the U.S. Appl. No. 17/487,622, dated May 25, 2023. 37 pages.

* cited by examiner

METHOD FOR MANUFACTURING MEMORY AND SAME

CROSS-REFERENCE TO RELATED APPLICATIONS

This application is a continuation application of International Application No. PCT/CN2021/103820, filed on Jun. 30, 2021, which claims priority to Chinese Patent Application No. 202011018122.5, filed on Sep. 24, 2020. The disclosures of International Application No. PCT/CN2021/103820 and Chinese Patent Application No. 202011018122.5 are hereby incorporated by reference in their entireties.

BACKGROUND

A memory is a memory component for storing programs and various data information. A random access memory is divided into a static random access memory and a dynamic random access memory. The dynamic random access memory usually includes a capacitor and a transistor connected with the capacitor. The capacitor is used to store charges that represent stored information, and the transistor is a switch that controls the inflow and release of the charges in the capacitor. When data are written, a word line gives a high level, the transistor is switched on, and a bit line charges the capacitor. When data are read, the word line also gives a high level, the transistor is switched on, and the capacitor is discharged, so that the bit line obtains a readout signal.

However, as the size of the process node of the memory continues to shrink, the performance of the memory needs to be improved.

SUMMARY

The embodiments of the disclosure relate to the field of semiconductors, and particularly relate to a method for manufacturing a memory and the same.

The embodiments of the disclosure provide a method for manufacturing a memory. The method for manufacturing a memory includes the following operations. A substrate and multiple separate initial bit line contact structures are provided, in which multiple active regions are provided in the substrate, each of the initial bit line contact structures is electrically connected with the active regions, and each of the initial bit line contact structures is partially located in the substrate. Pseudo-bit line structures are formed on the tops of the initial bit line contact structures. The initial bit line contact structures are etched to form bit line contact layers and gaps between the substrate and the side walls of the bit line contact layers. First dielectric layers on the side walls of the pseudo-bit line structures are formed, in which the first dielectric layers are also located right above the gaps.

The embodiments of the disclosure further provide a memory manufactured by the above method for manufacturing, including a substrate and multiple separate bit line contact layers, in which multiple active regions are provided in the substrate, and each of the bit line contact layers is electrically connected with the active regions, the bit line contact layers are partially located in the substrate, and gaps are provided between the substrate and the side walls of the bit line contact layers in the substrate; bit line conductive parts, which are located on the tops of the bit line contact layers; and first dielectric layers, which are located on the side walls of the bit line conductive parts and also located right above the gaps.

BRIEF DESCRIPTION OF THE DRAWINGS

One or more embodiments are exemplarily described by figures in the corresponding drawings. These exemplary descriptions do not constitute a limitation on the embodiments. Unless otherwise stated, the figures in the drawings do not constitute a scale limitation.

DETAILED DESCRIPTION

It can be seen from the background art that the performance of the memory in the prior art needs to be improved.

An analysis showed that the main reasons for the above problem include: as the size of a process node continues to shrink, the distance between a bit line contact layer and a buried word line is getting narrower and narrower, which leads to that the parasitic capacitance between the bit line contact layer and the buried word line is becoming larger and larger, thereby affecting the operating rate of the memory.

In order to solve the above problem, the embodiments of the disclosure provide a method for manufacturing a memory. By forming gaps between the substrate and the side walls of the bit line contact layers, the parasitic capacitance between a bit line contact layer and a buried word line is reduced, thereby improving the performance of the memory.

In order to make the objectives, technical solutions and advantages of the embodiments of the disclosure clearer, the embodiments of the disclosure will be described in detail below with reference to the accompanying drawings. However, a person of ordinary skill in the art can understand that in the embodiments of the disclosure, many technical details are presented for readers to better understand the disclosure. However, even without these technical details and various changes and modifications based on the following embodiments, the technical solutions claimed in the disclosure can also be realized.

The first embodiment of the disclosure provides a method for manufacturing a memory. FIG. 1 to FIG. 16 are schematic structural views corresponding to each of the steps in the manufacturing method.

Figure 1:
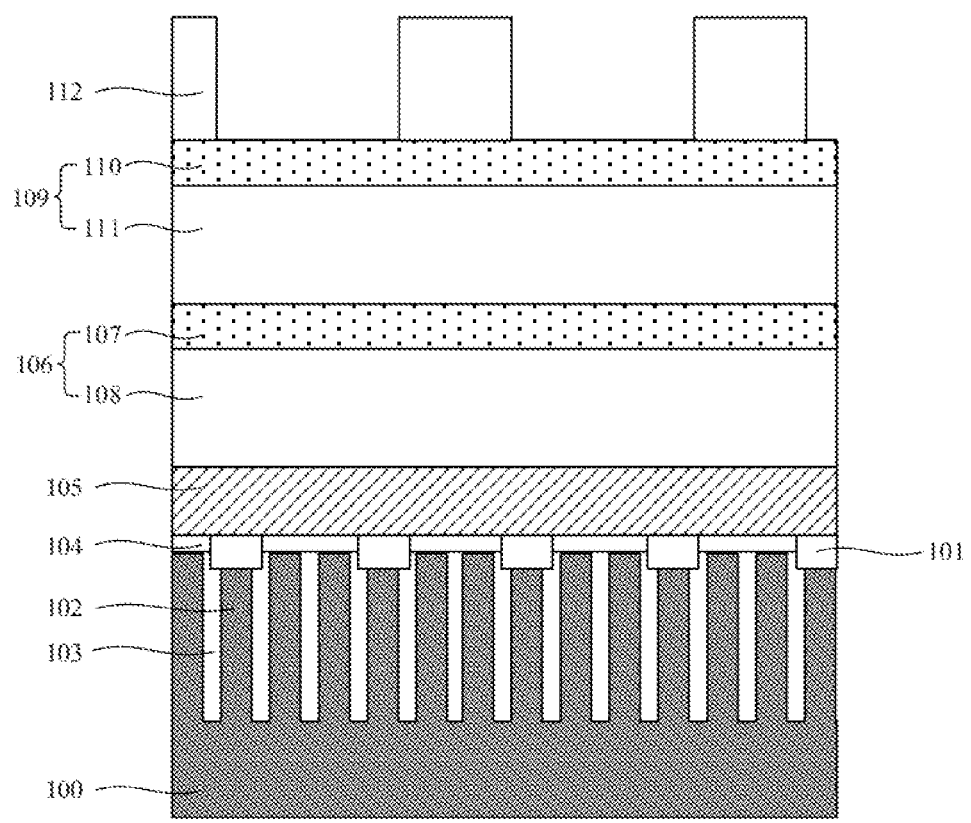
FIG. 1 to FIG. 16 are schematic structural views corresponding to each of the steps in a method for manufacturing a memory provided by the first embodiment of the disclosure.

Referring to FIG. 1, a substrate 100 and multiple separate initial bit line contact structures 101 are provided, in which multiple active regions 102 are provided in the substrate 100, and each of the initial bit line contact structures 101 is electrically connected with the active region 102.

The material of the substrate 100 includes silicon, germanium or other semiconductor materials.

First isolation layers 103 are filled in the regions between adjacent active regions 102, and the first isolation layers 103 are configured to isolate the multiple active regions 102. The material of the first isolation layers 103 is an insulating material, such as silicon dioxide.

In this embodiment, a part of each of the initial bit line contact structures 101 is located in the substrate 100, and the other part is higher than the surface of the substrate 100. A part of the initial bit line contact structure 101 is buried in the substrate 100, so that the parasitic capacitance of the memory can be reduced, and the performance of the memory can be improved. In other embodiments, the initial bit line contact structure may also be completely buried in the substrate, and the upper surface of the initial bit line contact structure is flush with the upper surface of the substrate.

The material of the initial bit line contact structure 101 is a conductive material, such as polysilicon.

In this embodiment, second isolation layers 104 may further be formed on the surface of the substrate 100. The second isolation layers 104 fill the regions between separate initial bit line contact structures 101 and are configured to isolate the multiple initial bit line contact structures 101. The top of the second isolation layer 104 may be flush with or not flush with the top of the initial bit line contact structure 101.

The material of the second isolation layer 104 is an insulating material, such as silicon nitride.

Referring to FIG. 1 to FIG. 6, pseudo-bit line structures 117 are formed on the tops of the initial bit line contact structures 101, and the initial bit line contact structures 101 are etched to form bit line contact layers 132 and gaps 130 between the substrate 100 and the side walls of the bit line contact layers 132.

A pseudo-bit line structure 117 is configured to define the position and size of a subsequently formed bit line structure. In other words, the size of the pseudo-bit line structure 117 is the same as the size of the subsequently formed bit line structure. Since the pseudo-bit line structure 117 does not need to possess conductivity, an insulating material may be used as the material of the pseudo-bit line structure 117.

The step of forming the pseudo-bit line structures 117 includes following operations. A pseudo-bit line layer 105 is formed on the substrate 100, which covers the initial bit line contact structures 101. Patterned mask layers 115 are formed on the pseudo-bit line layer 105; which is etched by taking the patterned mask layers 115 as a mask to form the pseudo-bit line structures 117.

Specifically, in this embodiment, the pseudo-bit line structures 117 are formed by a self-aligned double patterning (SADP) method.

The process for forming the pseudo-bit line structures 117 will be described in detail below with reference to the drawings.

Referring to FIG. 1, a pseudo-bit line layer 105 is formed on the substrate 100, which covers the initial bit line contact structures 101.

A bottom mask layer 106 and a core layer 109 which are sequentially stacked are formed on the pseudo-bit line layer 105. In this embodiment, the bottom mask layer 106 includes a first bottom mask layer 107 and a second bottom mask layer 108.

The material of the first bottom mask layer 107 is different from the material of the second bottom mask layer 108. Specifically, the material of the first bottom mask layer 107 may be silicon oxynitride, and the material of the second bottom mask layer 108 may be hydrogen-containing silicon oxide.

It can be understood that in other embodiments, the bottom mask layer may also be of a single-layer structure.

In this embodiment, the core layer 109 includes a first core layer 110 and a second core layer 111. The material of the first core layer 110 includes silicon oxynitride. The material of the second core layer 111 includes hydrogen-containing silicon oxide.

In other embodiments, the core layer may also be of a single-layer structure.

A patterned photoresist layer 112 is formed on the core layer 109.

Figure 2:
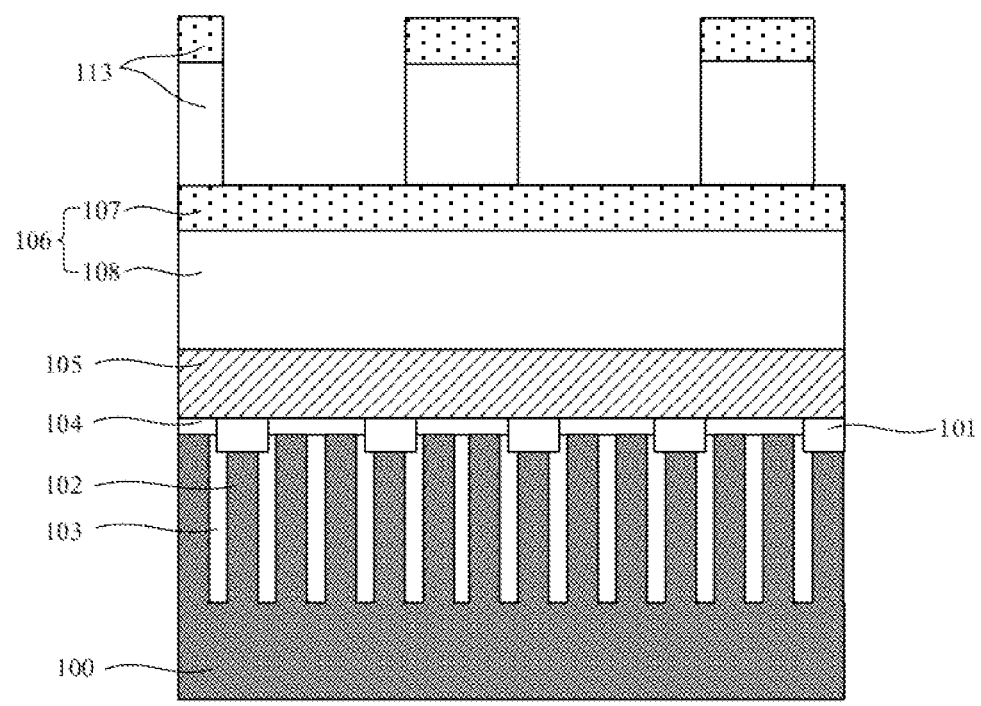

Referring to FIG. 2, the core layer 109 (referring to FIG. 1) is etched by taking the patterned photoresist layer 112 (referring to FIG. 1) as a mask to form multiple separate core parts 113. The core part 113 is of a double-layer structure. In other embodiments, the core part may also be of a single-layer structure.

After the core parts 113 are formed, the patterned photoresist layer 112 is removed.

Figure 3:
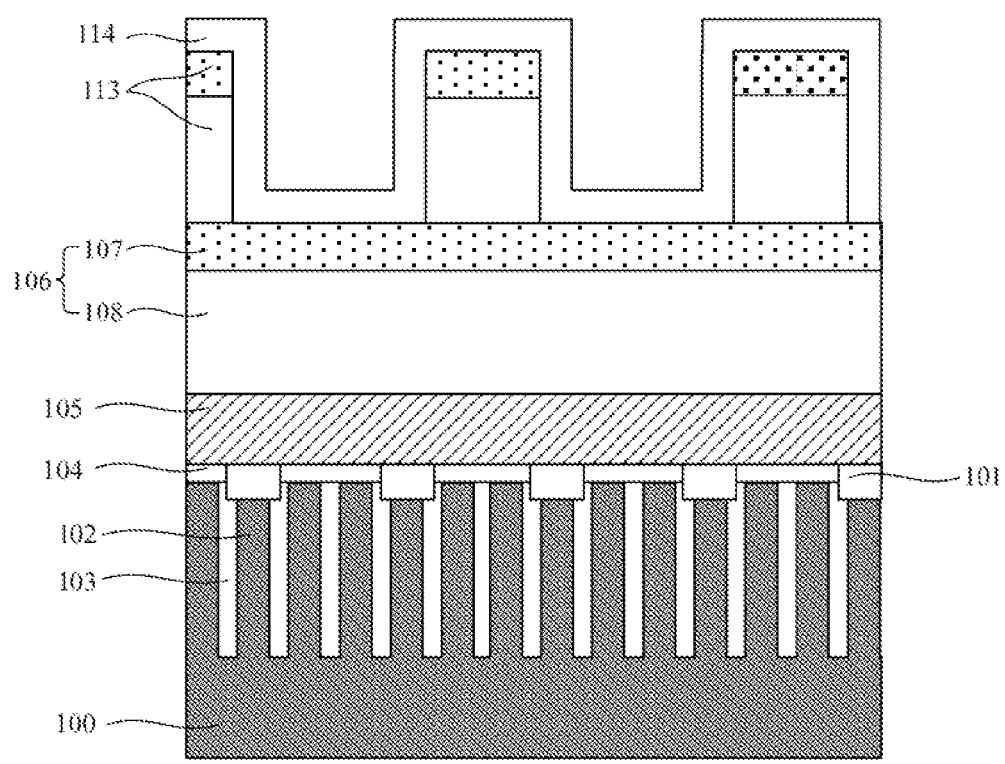

Referring to FIG. 3, a side wall film 114 covering the tops and side walls of the core parts 113 and the bottom mask layer 106 is formed.

In this embodiment, the side wall film 114 is deposited by an atomic layer deposition process. The thickness of the side wall film 114 formed by the atomic layer deposition process is more uniform. In other embodiments, the side wall film may be formed by a chemical vapor deposition method, a physical vapor deposition method, etc.

The material of the side wall film 114 is different from that of the core part 113, and may be silicon oxide, for example.

Figure 4:
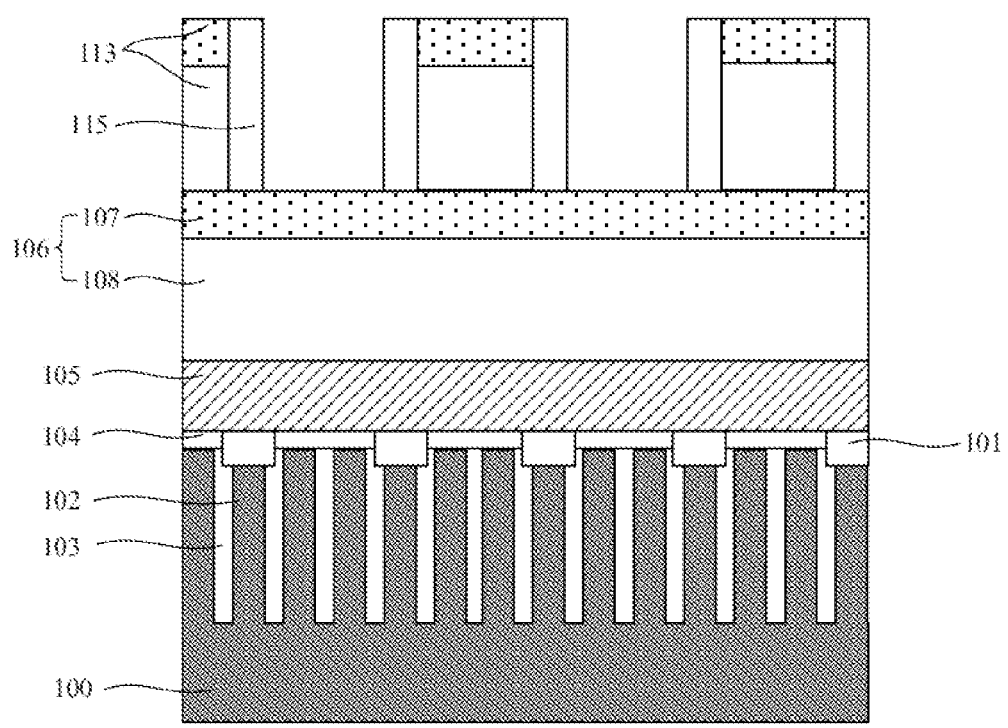

Referring to FIG. 4, the side wall film 114 (referring to FIG. 3) is etched to form side wall layers 115 located on opposite side walls of the core parts 113. Due to the etch loading effect i.e. the larger the etching area is, the easier it is to be etched, the side wall film 114 (referring to FIG. 3) deposited on the side walls of the core parts 113 is not easy to be etched, thereby forming the side wall layers 115.

Figure 5:
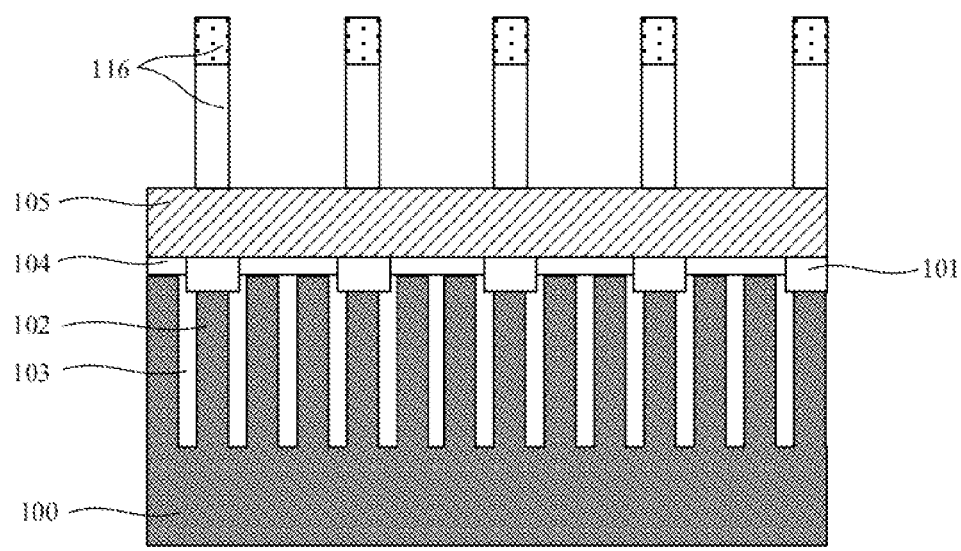

Referring to FIG. 5, the core parts 113 (referring to FIG. 4) are removed, and the side wall layers 115 are taken as patterned mask layers 115.

The bottom mask layer 106 (referring to FIG. 4) is etched by taking the patterned mask layers 115 as a mask to form patterned bottom mask layers 116. In this embodiment, the patterned bottom mask layer 116 is of a double-layer structure. In other embodiments, the patterned bottom mask layer may also be of a single-layer structure.

Figure 6:
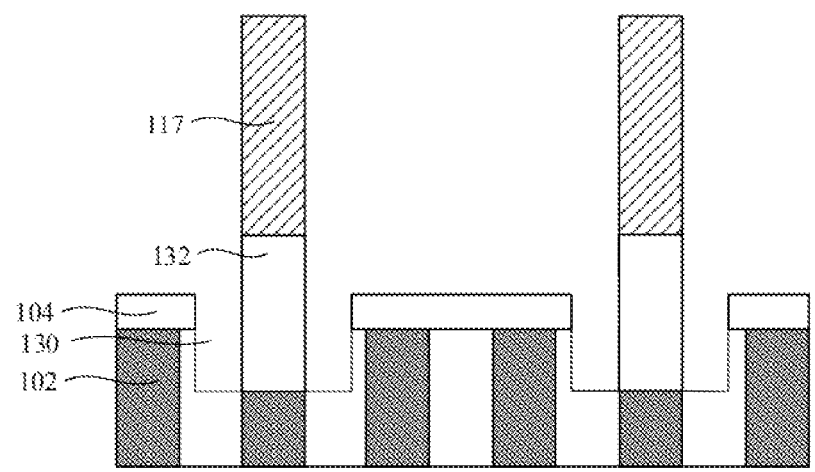

Referring to FIG. 6, the pseudo-bit line layer 105 (referring to FIG. 5) is etched by taking the patterned bottom mask layers 116 (referring to FIG. 5) as a mask to form pseudo-bit line structures 117.

In this embodiment, the patterned mask layers 115 (referring to FIG. 4) transmit the pattern to the pseudo-bit line structures 117 through the patterned bottom mask layers 116. Therefore, the width of the pseudo-bit line structure 117 is consistent with the width of the patterned mask layer 115. The smaller the width of the patterned mask layer 115, the smaller the width of the pseudo-bit line structure 117, and the smaller the size of the memory.

The material of the pseudo-bit line structure 117 includes silicon nitride, silicon oxynitride or silicon carbonitride.

It should be noted that in other embodiments, the pseudo-bit line structure may also be formed without using the SADP process. For example, a single hard mask layer is formed on the pseudo-bit line layer directly. The hard mask layer is subjected to a lithography process to form multiple separate core parts located on the pseudo-bit line layer. A side wall film covering the tops and side walls of the core parts and the pseudo-bit line layer is formed. The side wall film is etched to form side wall layers on opposite side walls of the core parts. The core parts are removed, and taking the side wall layers as patterned mask layers. The pseudo-bit line layer is etched by means of the patterned mask layers to form the pseudo-bit line structures.

Continuing to refer to FIG. 6, in this embodiment, the step of forming gaps 130 includes the following operations. After the pseudo-bit line structures 117 are formed, the second isolation layers 104 and the initial bit line contact structures 101 are etched by taking the patterned bottom mask layers 116 (referring to FIG. 5) as a mask, so as to form bit line contact layers 132 and gaps 130 between the substrate 100 and the side walls of the bit line contact layers 132. In this embodiment, the formation of the pseudo-bit line structures 117 and the formation of the initial bit line contact structure 101 are performed in the same lithography process, so that process steps can be reduced. In other embodiments, the patterned bottom mask layers may also be removed after the pseudo-bit line structures are formed, and the initial bit line contact structures are etched by taking the pseudo-bit line structures as a mask.

It should be noted that since the gaps 130 are formed by the SADP process in this embodiment, the initial bit line contact structures 101 are etched by taking the patterned bottom mask layers 116 as a mask. In other embodiments, the single hard mask layer may be formed on the pseudo-bit line layer only. The hard mask layer is subjected to a lithography process to form core parts. Side wall layers are formed on the side walls of the core parts. The pseudo-bit line layer and the initial bit line contact structures are etched by taking the side wall layers as the patterned mask layers to form the bit line contact layers.

The gaps 130 are formed between the substrate 100 and the side walls of the bit line contact layers 132 (referring to FIG. 5), so that the parasitic capacitance between the bit line contact layer 132 and the buried word line (not shown) can be reduced.

Figure 7:
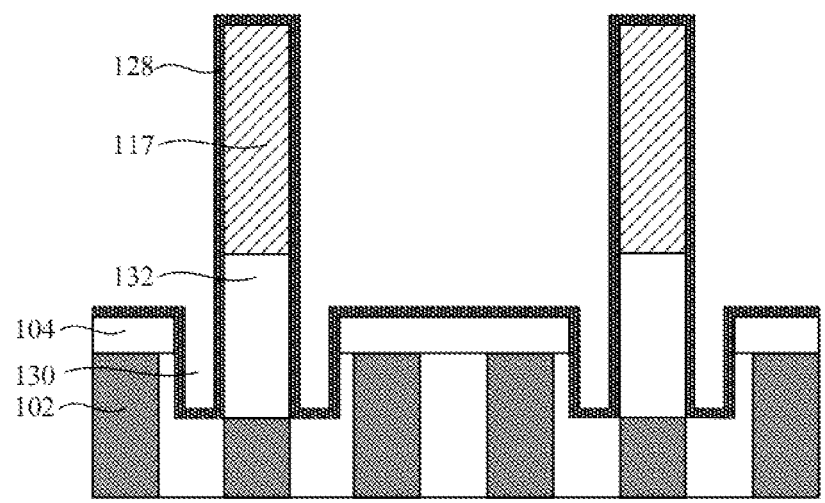
Figure 8:
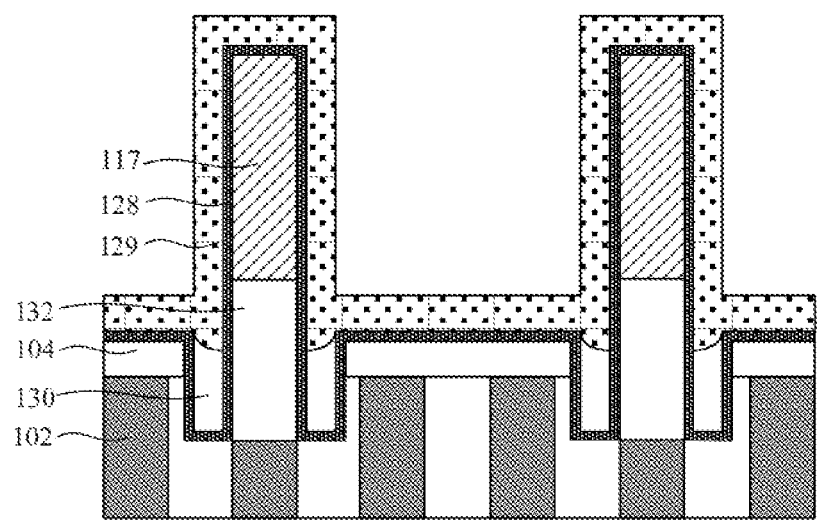
Figure 9:
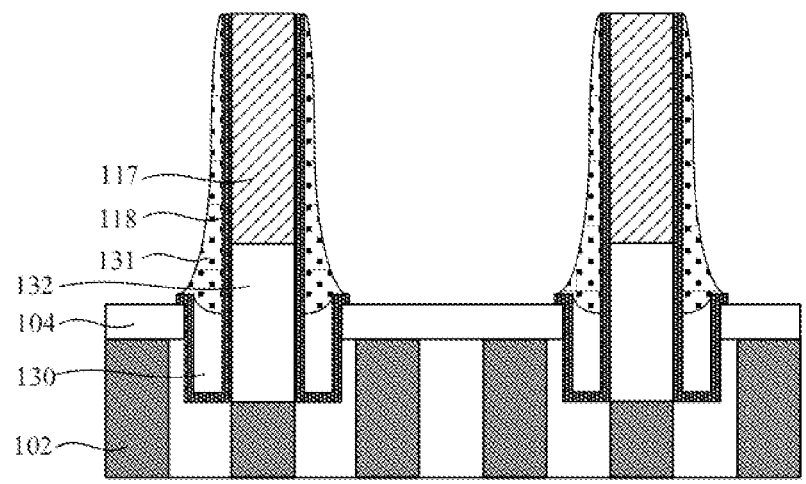

Referring to FIG. 7 to FIG. 9, first dielectric layers 131 on the side walls of the pseudo-bit line structures 117 are formed, second dielectric layers 118 covering the side walls of the pseudo-bit line structures 117 are formed, and the first dielectric layers 131 also cover the side walls of the second dielectric layers 118.

The material of the first dielectric layer 131 includes a low dielectric constant material.

The material of the second dielectric layer 118 includes a low dielectric constant material. A dielectric of which the dielectric constant is lower than that of silicon dioxide is a low dielectric constant material. The low dielectric constant material can reduce the parasitic capacitance of the memory and increase the operating rate of the memory.

Specifically, in this embodiment, the process step of forming the first dielectric layers 131 and the second dielectric layers 118 includes the following operation. Referring to FIG. 7, an initial second dielectric film 128 is formed on the side walls and tops of the pseudo-bit line structures 117, the side walls of the bit line contact layers 132, the surfaces of the second isolation layers 104 and the bottoms of the gaps 130.

Referring to FIG. 8, an initial first dielectric film 129 is formed on the side walls and tops of the pseudo-bit line structures 117, part of side walls of the bit line contact layers 132 and the second isolation layers 104, in which the initial first dielectric film 129 also covers part of the initial second dielectric film 128.

In this embodiment, the initial first dielectric film 129 is formed by a rapid deposition process, such as a plasma chemical vapor deposition process or a plasma physical vapor deposition process. The deposition rate is faster, which leads to that the step coverage is poor, such that the gaps 130 cannot be filled. The dielectric constant of air in the gaps 130 is extremely low, such that the parasitic capacitance between the bit line contact layer 132 and buried word line (not shown) can be effectively reduced.

In this embodiment, the initial first dielectric film 129 may be formed by a plasma chemical vapor deposition process.

Referring to FIG. 9, the initial first dielectric film 129 (referring to FIG. 8) and the initial second dielectric film 128 (referring to FIG. 8) are etched to form the first dielectric layers 131 located on the side walls of the pseudo-bit line structures 117 and part of side walls of the bit line contact layers 132 and the second dielectric layers 118 covering the side walls of the pseudo-bit line structures 117, the side walls of the bit line contact layers 132 and the bottoms of the gaps 130. The first dielectric layers 131 are located right above the gaps 130.

In other embodiments, the first dielectric layers may not be located on part of side walls of the bit line contact layers.

In other embodiments, the second dielectric layers may not be provided.

Figure 10:
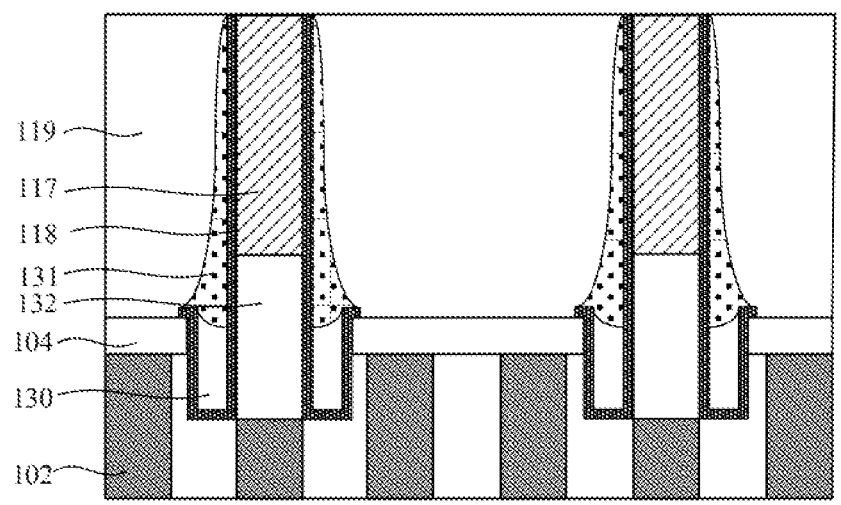

Referring to FIG. 10, sacrificial layers 119 filling the regions between adjacent pseudo-bit line structures 117 are formed, in which the sacrificial layers 119 also cover the side walls of the first dielectric layers 131.

The sacrificial layers 119 also cover the surfaces of the second isolation layers 104.

The material of the sacrificial layer 119 is different from the material of the first dielectric layer 131, and may be silicon oxide, for example.

Figure 11:
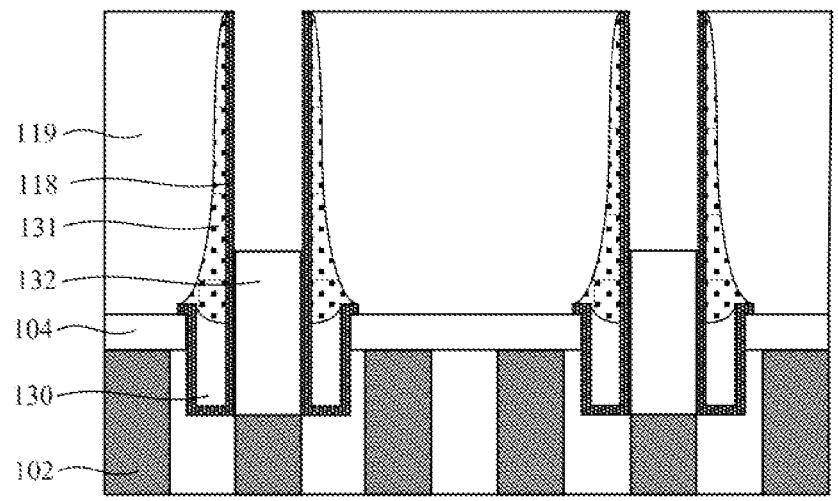

Referring to FIG. 11, the pseudo-bit line structures 117 (referring to FIG. 10) are removed to form through holes exposing the bit line contact layers 132.

In this embodiment, the etching rate of the pseudo-bit line structure 117 is greater than the etching rate of the sacrificial layer 119, in which the etching selection ratio of the material of the pseudo-bit line structure 117 to the material of the sacrificial layer 119 is from 5 to 15, such as 8, 10 and 13. The pseudo-bit line structures 117 are removed by a wet etching process, in which the etching solvent is a hot phosphoric acid solution. In other embodiments, the pseudo-bit line structures may also be removed by a dry etching process.

Figure 12:
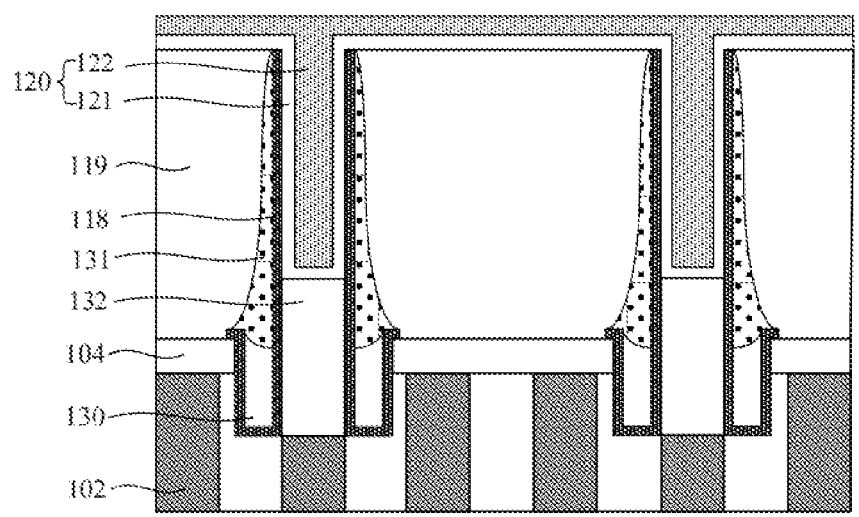
Figure 13:
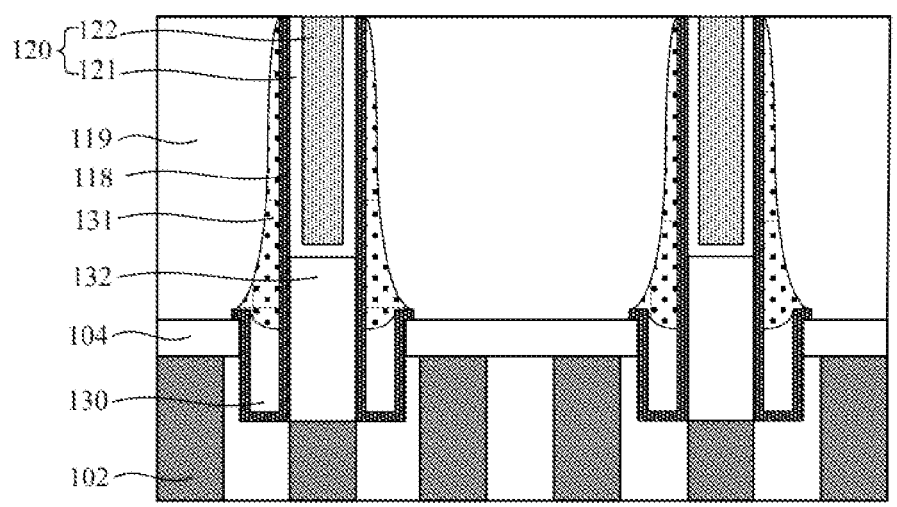

Referring to FIG. 12 and FIG. 13, bit line conductive parts 120 filling the through holes and covering the bit line contact layers 132 are formed.

A bit line conductive part 120 is the conductive structure in the bit line structure. The bit line conductive part 120 is formed by filling the through hole. The bit line conductive part 120 is supported by the sacrificial layer 119 during the formation process. Therefore, even if the width of the bit line conductive part 120 is narrow, the phenomenon of tilting or collapse is unlikely to occur. In addition, since the etching process is not used, impurities generated by an etching process will not remain in the bit line conductive parts 120. Thus, the resistance of the bit line conductive part 120 is reduced, and the operating speed of the memory is increased.

The step of forming the bit line conductive parts 120 includes the following operations. A barrier layer 121 is formed on the bottoms and side walls of the through holes; and a conductive layer 122 filling up the through holes is formed on the surface of the barrier layer 121.

In this embodiment, the thickness of the conductive layer 122 and the barrier layer 121 formed by an atomic layer deposition process is more uniform. In other embodiments, other deposition processes may also be used.

The material of the barrier layer 121 includes one or both of tantalum nitride and titanium nitride. Tantalum nitride or titanium nitride can conduct electricity, has a good blocking ability, and can block the diffusion of the conductive layer 122. The material of the conductive layer 122 includes one or more of ruthenium, tungsten, gold or silver. Ruthenium, tungsten, gold or silver is a low-resistance metal, which can further reduce the resistance of the conductive layer 122 and increase the operating speed of the memory.

In other embodiments, the bit line conductive part may also be of a single-layer structure.

In this embodiment, as shown in FIG. 12, the formed conductive layer 122 and the barrier layer 121 are also located on the top surface of the sacrificial layer 119. As shown in FIG. 13, the bit line conductive parts 120 are flattened to remove, and the conductive layer 122 and the barrier layer 121, which are higher than the top surface of the sacrificial layer 119 (referring to FIG. 12)

In this embodiment, the bit line conductive part 120 is flattened by a chemical-mechanical polishing process.

Figure 14:
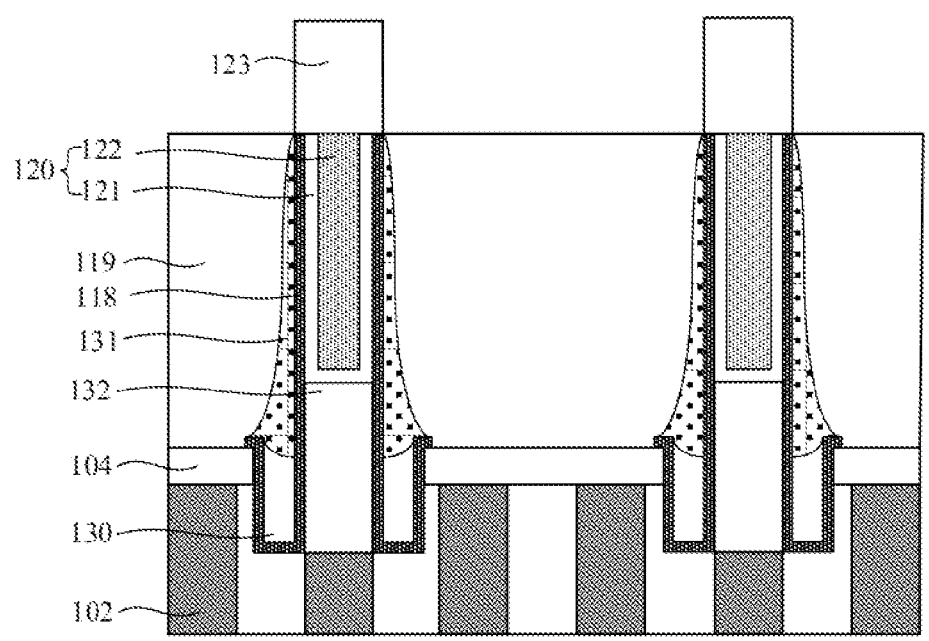

Referring to FIG. 14, insulating cover layers 123 are formed on the tops of the bit line conductive parts 120.

The insulating cover layer 123 is configured as the insulating structure in the bit line structure.

In this embodiment, the insulating cover layers 123 are formed by the SADP process, and the sizes of the insulating cover layers 123 formed by the SADP process are more accurate.

Figure 15:
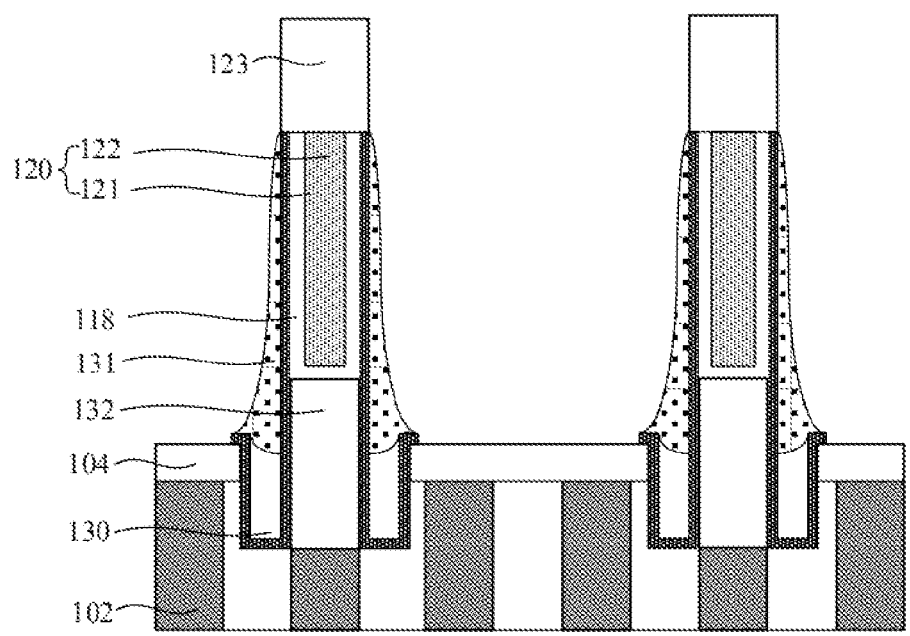

Referring to FIG. 15, after the insulating cover layers 123 are formed, the sacrificial layers 119 (referring to FIG. 14) are removed.

The etching rate of the sacrificial layer 119 is greater than the etching rate of the insulating cover layer 123, in which the etching selection ratio of the material of the sacrificial layer 119 to the material of the insulating cover layer 123 is from 5 to 15, such as may be 8, 10 and 13. A high etching selection ratio can ensure that in the process of removing the sacrificial layers 119, the original shape and size of the insulating cover layer 123 are maintained. In this embodiment, the sacrificial layers 119 are removed by a wet etching method, in which an etching reagent is hydrofluoric acid solution. In other embodiments, the sacrificial layers may also be removed by a dry etching process.

Figure 16:
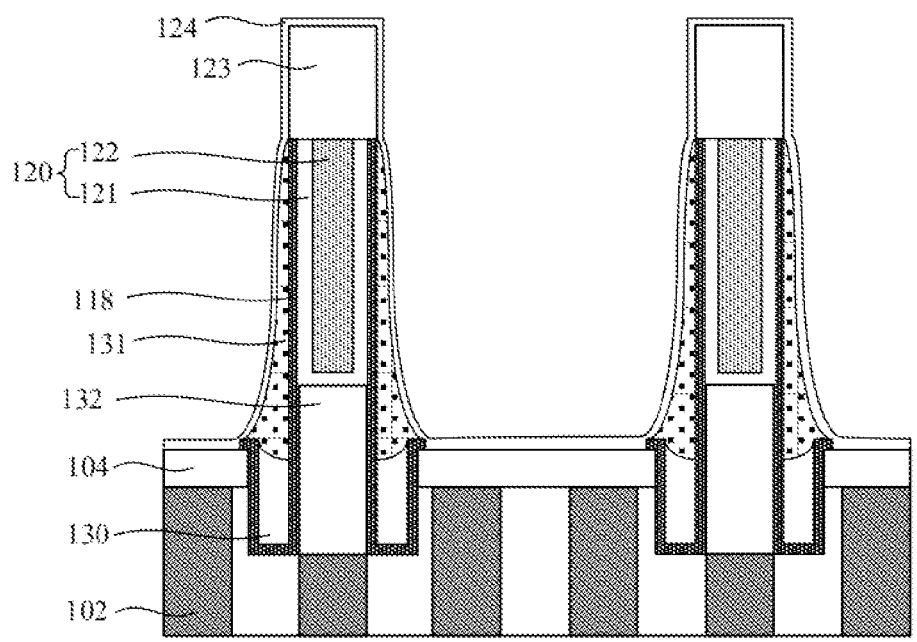

Referring to FIG. 16, a protective layer 124 is formed on the surfaces of the first dielectric layers 131 and the insulating cover layers 123.

In this embodiment, the protective layer 124 is also located on the surface of the second isolation layer 104.

In this embodiment, the protective layer 124 is formed by an atomic layer deposition process.

The material of the protective layer 124 includes silicon carbonitride.

In conclusion, in this embodiment, the gaps are formed between the substrate 100 and the bit line contact layers 132, so that the parasitic capacitance between the bit line contact layer 132 and buried word line can be reduced, further increasing the operating rate of the memory.

Figure 17:
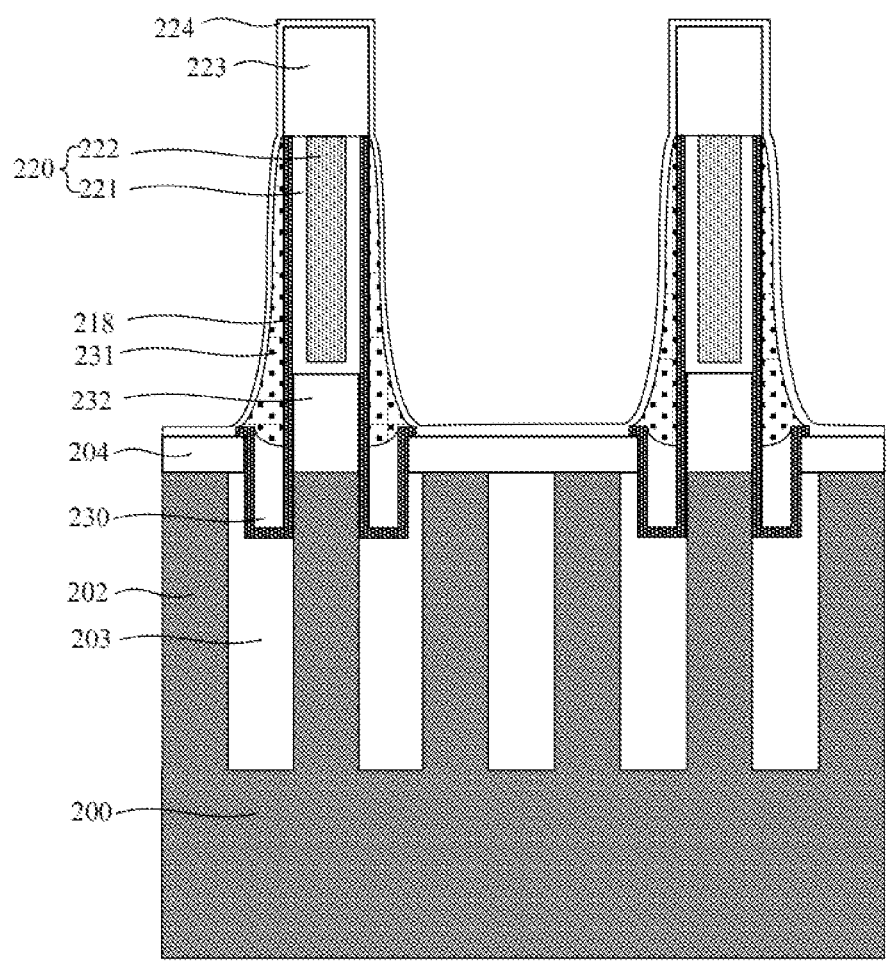
FIG. 17 is a schematic structural view of a memory provided by the second embodiment of the disclosure.

The second embodiment of the disclosure also provides a memory which may be manufactured by the method for manufacturing of the memory in the first embodiment. FIG. 17 is a schematic structural view of a memory provided by this embodiment. Referring to FIG. 17, the memory includes a substrate 200 and multiple separate bit line contact layers 232, in which multiple active regions 202 are provided in the substrate 200, each of the bit line contact layers 232 is electrically connected with the active region 202, a part of each of the bit line contact layers 232 is partially located in the substrate 200, and gaps 230 are formed between the substrate 200 and the side walls of the bit line contact layers 232 in the substrate 200; bit line conductive parts 220 located on the tops of the bit line contact layers 232; and first dielectric layers 231 located on the side walls of the bit line conductive parts 220 and also located right above the gaps 230.

The memory provided by the embodiment will be described in detail below with reference to the drawings.

First isolation layers 203 are also formed between the active regions 202, and the first isolation layers 203 are configured to isolate the active regions 202.

The substrate 200 further includes second isolation layers 204 located on its surface, and the second isolation layers 204 are configured to isolate the bit line contact layers 232.

A bit line conductive part 220 further includes: a conductive layer 222 located on the top of the bit line contact layer 232, and a barrier layer 221 located between the bit line contact layer 232 and the conductive layer 222, in which the barrier layer 221 further covers the side walls of the conductive layer 222.

The material of the conductive layer 222 includes one or more of ruthenium, tungsten, gold or silver. Ruthenium, tungsten, gold or silver is a low-resistance metal, which can reduce the resistance of the conductive layer 222, and increase the operating speed of the memory.

The material of the barrier layer 221 is a conductive material, such as tantalum nitride or titanium nitride.

The thickness of the barrier layer 221 is from 2.5 nm to 6 nm, such as 3 nm. The barrier layer 221 with this thickness has a good ability to block the diffusion of the conductive layer 222.

The memory of this embodiment further includes. second dielectric layers 218 which are located on the side walls of the bit line conductive parts 220 and the bit line contact layers 232 and also located on the bottoms of the gaps 230; insulating cover layers 223 which are located on the tops of the bit line conductive parts 220; and a protective layer 224 which is located on the surface of the insulating cover layers 223 and the first dielectric layers 231 and also located on the surface of the second isolation layers 204.

In conclusion, the gaps 230 are provided between the side walls of the bit line contact layers 232 and the substrate 200 of the memory provided by this embodiment, so that the parasitic capacitance between a bit line contact layer 232 and a buried word line can be reduced, and the performance of the memory can be improved.

A person of ordinary skill in the art can understand that the above embodiments are specific embodiments for implementing the disclosure. In practical applications, various changes can be made in forms and details without departing from the spirit and scope of the disclosure. Any person skilled in the art can make changes and modifications without departing from the spirit and scope of the disclosure. Therefore, the protection scope of the disclosure shall be subject to the scope defined by the claims.

INDUSTRIAL APPLICABILITY

In the embodiments of the disclosure, the method for manufacturing a memory includes the following operations. A substrate and multiple separate initial bit line contact structures are provided, in which multiple active regions are provided in the substrate, and each of the initial bit line contact structures is electrically connected with the active region. Each of the initial bit line contact structures is partially located in the substrate. Pseudo-bit line structures are formed on the tops of the initial bit line contact structures. The initial bit line contact structures are etched to form bit line contact layers and gaps between the substrate and the side walls of the bit line contact layers. First dielectric layers on the side walls of the pseudo-bit line structures are formed, and the first dielectric layers are also located right above the gaps. In this way, the parasitic capacitance between a bit line contact layer and a buried word line can be reduced, thereby increasing the operating rate of the memory.

The invention claimed is:

1. A method for manufacturing a memory, comprising:
providing a substrate and a plurality of separate initial bit line contact structures, wherein a plurality of active regions are provided in the substrate, each of the initial bit line contact structures is electrically connected with a corresponding one of the active regions, and each of the initial bit line contact structures is partially located in the substrate;
forming pseudo-bit line structures on tops of the initial bit line contact structures;
etching the initial bit line contact structures to form bit line contact layers and gaps located between the substrate and side walls of the bit line contact layers;
forming first dielectric layers on side walls of the pseudo-bit line structures, wherein the first dielectric layers are also located right above the gaps;
forming sacrificial layers filling regions between adjacent pseudo-bit line structures of the pseudo-bit line structures and also covering side walls of the first dielectric layers after forming the first dielectric layers;
removing the pseudo-bit line structures to form through holes exposing the bit line contact layers after forming the sacrificial layers; and
forming bit line conductive parts filling the through holes and covering the bit line contact layers.

2. The method for manufacturing a memory of claim 1, wherein the step of forming the pseudo-bit line structures comprises: forming a pseudo-bit line layer on the substrate, wherein the pseudo-bit line layer covers the initial bit line contact structures; forming patterned mask layers on the pseudo-bit line layer; and etching the pseudo-bit line layer by taking the patterned mask layers as a mask to form the pseudo-bit line structures.

3. The method for manufacturing a memory of claim 2, wherein the step of forming the patterned mask layers comprises: forming a plurality of separate core parts on the pseudo-bit line layer; forming a side wall film covering tops and side walls of the core parts and the pseudo-bit line layer; etching the side wall film to form side wall layers on opposite side walls of the core parts; and removing the core parts, and taking the side wall layers as the patterned mask layers.

4. The method for manufacturing a memory of claim 2, wherein the step of forming the gaps comprises: after forming the pseudo-bit line structures, etching the initial bit line contact structures by taking the patterned mask layers as the mask to form the bit line contact layers and the gaps.

5. The method for manufacturing a memory of claim 1, wherein the step of forming the first dielectric layers comprises: forming an initial first dielectric film on the side walls and tops of the pseudo-bit line structures, part of the side walls of the bit line contact layers and the substrate; and etching the initial first dielectric film to form the first dielectric layers on the side walls of the pseudo-bit line structures and the part of the side walls of the bit line contact layers.

6. The method for manufacturing a memory of claim 1, wherein a material of the first dielectric layers comprises a low dielectric constant material.

7. The method for manufacturing a memory of claim 1, further comprising: after forming the pseudo-bit line structures, forming second dielectric layers covering the side walls of the pseudo-bit line structures, wherein the first dielectric layers also cover side walls of the second dielectric layers.

8. The method for manufacturing a memory of claim 7, wherein a material of the second dielectric layers comprises a low dielectric constant material.

9. The method for manufacturing a memory of claim 1, wherein the step of forming the bit line conductive parts comprises: forming barrier layers on bottoms and side walls of the through holes; and forming conductive layers filling the through holes on a surface of the barrier layers.

10. The method for manufacturing a memory of claim 1, wherein after forming the bit line conductive parts, the method further comprises: forming insulating cover layers on tops of the bit line conductive parts; after forming the insulating cover layers, removing the sacrificial layers; and after removing the sacrificial layers, forming a protective layer on surfaces of the first dielectric layers and the insulating cover layers.

11. A method for manufacturing a memory, comprising:
providing a substrate and a plurality of separate initial bit line contact structures, wherein a plurality of active regions are provided in the substrate, each of the initial bit line contact structures is electrically connected with a corresponding one of the active regions, and each of the initial bit line contact structures is partially located in the substrate;
forming pseudo-bit line structures on tops of the initial bit line contact structures;
etching the initial bit line contact structures to form bit line contact layers and gaps located between the substrate and side walls of the bit line contact layers; and
forming first dielectric layers on side walls of the pseudo-bit line structures, wherein the first dielectric layers are also located right above the gaps;
wherein the step of forming the pseudo-bit line structures comprises:
  forming a pseudo-bit line layer on the substrate, wherein the pseudo-bit line layer covers the initial bit line contact structures;
  forming patterned mask layers on the pseudo-bit line layer; and
  etching the pseudo-bit line layer by taking the patterned mask layers as a mask to form the pseudo-bit line structures;
wherein the step of forming the patterned mask layers comprises:
  forming a plurality of separate core parts on the pseudo-bit line layer;
  forming a side wall film covering tops and side walls of the core parts and the pseudo-bit line layer;
  etching the side wall film to form side wall layers on opposite side walls of the core parts; and
  removing the core parts, and taking the side wall layers as the patterned mask layers.

12. The method for manufacturing a memory of claim 11, wherein the step of forming the gaps comprises: after forming the pseudo-bit line structures, etching the initial bit line contact structures by taking the patterned mask layers as the mask to form the bit line contact layers and the gaps.

13. The method for manufacturing a memory of claim 11, wherein the step of forming the first dielectric layers comprises: forming an initial first dielectric film on the side walls and tops of the pseudo-bit line structures, part of the side walls of the bit line contact layers and the substrate; and etching the initial first dielectric film to form the first dielectric layers on the side walls of the pseudo-bit line structures and the part of the side walls of the bit line contact layers.

14. The method for manufacturing a memory of claim 11, further comprising: after forming the pseudo-bit line structures, forming second dielectric layers covering the side walls of the pseudo-bit line structures, wherein the first dielectric layers also cover side walls of the second dielectric layers.

15. The method for manufacturing a memory of claim 14, wherein a material of the first dielectric layers comprises a low dielectric constant material; and a material of the second dielectric layers comprises a low dielectric constant material.

* * * * *